United States Patent [19]

Boatmun

[11] Patent Number: 4,771,169
[45] Date of Patent: Sep. 13, 1988

[54] OPTICAL DIGITAL PROCESSING DEVICE

[76] Inventor: Dewey L. Boatmun, Rte. 1, Box 71, Cashion, Okla. 73016

[21] Appl. No.: 27,454

[22] Filed: Mar. 18, 1987

[51] Int. Cl.[4] .............................................. G11C 13/00
[52] U.S. Cl. .................................. 250/213 A; 365/114
[58] Field of Search ..................... 250/213 A; 357/19; 365/114

[56] References Cited

U.S. PATENT DOCUMENTS 3,680,808 7/1972 Maure .............................. 250/213 A
4,626,878 12/1986 Kuwano et al. ....................... 357/19

*Primary Examiner*—David C. Nelms
*Assistant Examiner*—Stephone B. Allen
*Attorney, Agent, or Firm*—Robert K. Rhea

[57] ABSTRACT

This invention consists of three separate functional devices fabricated from a single monolithic semiconductor chip. The three devices may be constructed as a unit to work in concert, or any of the three devices may be constructed alone in order to perform its particular operation independently.

The three functional devices are: an optical modulator; an optical demodulator; and, an integrated optical logic device operating in unison and utilizing coherent light from a self contained laser diode for transmitting and receiving data and performing extremely high speed logical operations photonically.

8 Claims, 3 Drawing Sheets

OPTICAL DIGITAL PROCESSING DEVICE

BACKGROUND OF THE INVENTION

1. Field of the Invention

This invention relates in general to the manipulation of light waves for the purpose of transmitting, receiving and processing digital information, and more particularly to the modulating, detecting and performing of logical operations with coherent light.

2. Description of the Prior Art

It has been known for some time that the use of light as a medium for the transmission of information has distinct advantages over conventional means, primarily because of the tremendous bandwidth available at such short wavelengths. With the introduction of light emitting diodes and more particularly of lasers, the technology became a reality and now data transmissions at the rate of one billion bits per second can be sent from point to point over optical fibers many miles in length. The highest transmission rate achieved thus far is about twenty billion pulses per second, accomplished by multiplexing several lasers operating at different wavelengths. Even this rate, however, is but a fraction of the theoretical maximum for a light source operating, for instance, at a wavelength of 900 nanometers. The primary limiting factor in the transmission rate is the frequency at which a light source (typically a light emitting diode or a laser) can be turned on and off. The apparent maximum is about one billion hertz. The present invention does not turn a laser on and off, but modulates the light by an indirect method.

Likewise, detecting high repetition rate light pulses is difficult, and has about the same upper limit with devices now in use (PIN diodes and avalanche photodiodes, etc.). The present invention has a means of detecting high rate, low power light pulses.

It has also been known for some time that if a way could be found to use photons, as opposed to electrons, as a basis for devices which can perform logical operations, that such devices would have substantial advantages (primarily in processing speed) over conventional devices. These logical operations; logical AND, logical OR, INVERT, and EXCLUSIVE OR are the building blocks of most digital electronic circuits.

An optical logic device would preferably be subject to miniaturization and high density packaging, have quantized inputs and outputs, and lend itself to inexpensive mass production. The invention described herein performs extremely high speed logical operations, can be made to interface with most digital devices presently in use, has highly quantized inputs and outputs, and can be mass manufactured in high density packaging with currently available photolithographic techniques.

Many optically bistable devices have been proposed, and several have recently been constructed. All take advantage of the nonlinearity in the refractive index of certain mediums, and most make use of a tuned cavity, or interferometer, in which the refractive index is changed by electrical or electromagnetic energy injections. I believe that it is unnecessary to confine coherent light in a tuned cavity in order to exercise control over the phase and amplitude of the light. If the phase of one-half the photons in any beam of coherent light can be changed with respect to the other half, the amplitude and phase of the composite beam can be controlled. Moreover, the use of a tuned cavity incorporates some of the same problems that plague the pulsed laser itself. That is, the speed at which it operates depends to a great degree on the time it takes for the relections inside the cavity to die out after the transition from on to off. The length of one bit of information is dependent on the optical length of the cavity. The operation of these types of devices, in most instances, employs a reference beam to hold the cavity just below a threshold level, and a second modulated probe beam to push the cavity past the threshold, which exponentially increases the output. This, however, does not address the original problem of how to increase the modulation frequency of the probe beam.

The present invention does address this problem and is not restricted by the liabilities of a tuned cavity. A tuned cavity or interferometer is also extremely temperature sensitive. Since the present invention relies on complimentary halves of the same crystal, phase changes due to temperature variations are the same in both halves. A tuned cavity also requires a full 180° phase shift in the cavity in order to achieve true bistability (90° change in the optical length of the cavity). In the present invention, any unit of phase shift can be considered a transition from an absolute logical low to an absolute logical high.

SUMMARY OF THE INVENTION

A digital information processor consisting of three separate functional devices fabricated from a single monolithic semiconductor chip utilizing coherent-light-for performing extremely high speed digital operations. The three devices are: an optical modulator; an optical demodulator; and, an integrated optical logic device in which three parallel equally dimensioned electrically isolated light channels, transparent at the wave length of a selected laser diode, are defined by a crystal deposit of a light emitting compound. The position of the laser and the three light channels are fixed relative to each other by a grounded metallic supporting base.

The optical modulator and logic device each utilize the laser diode and two of the light channels with the optical modulator forming a shift register in which binary data from a parallel electrical data bus loaded simultaneously into the input of the shift register are emitted as a serial) binary train of light pulses at its output. The optical demodulator, utilizing the remaining light channel, operates at the speed of the optical modulator.

The primary objective of the invention is to improve upon the speed and versatility of photonics.

DESCRIPTION OF THE PREFERRED EMBODIMENTS

Figure 1:
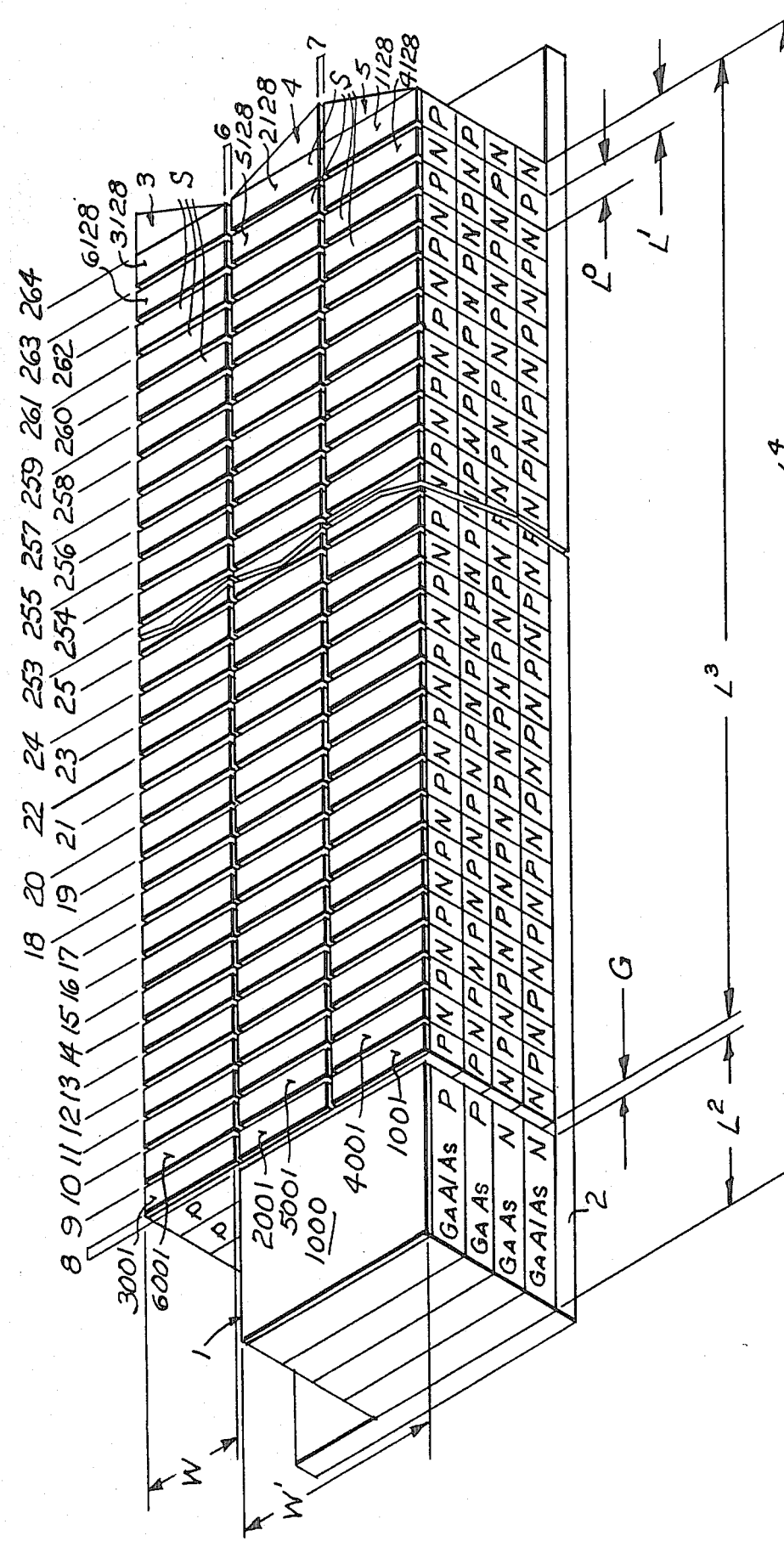
FIG. 1 is a fragmentary diagram of the photonic integrated circuit.

Like characters of reference designate like parts in those figures of the drawings in which they occur.

In the drawings:

The optical modulator will be referred to as "the optical modulator". The optical demodulator will be referred to as "the optical demodulator". The integrated optical logic device will be referred to as "the logic device". The photonic integrated circuit which consists of all the above will be referred to as "the device".

The device is constructed in the following manner:

A crystal C is grown on a conductive metallic base 2 by any crystal growth process, such as vacuu evaporation deposition, or molecular beam expitaxy. The metal base 2 is a type which resists chemical etching, such as gold. The crystal may be any one of several combinations of the light emitting binary, ternary, or quaternary compounds composed of the "so called" III–V elements (Groups III and V of the periodic table). The crystal will consist of three layers, for example they will be (from bottom to top) as viewed in FIG. 1: gallium aluminum arsenide GaAlAs, gallium arsenide GaAs; and gallium aluminum arsenide GaAlAs. The crystal is capped with a conductive metallic top surface S which will not resist etching, such as aluminum. The crystal will be doped as shown by FIG. 1. Any semiconductor element or compound has a characteristic band gap and other specific electrical characteristics. These electrical characteristics can be modified or tailored, however, by the introduction of impurities, or "dopants" into the crystal structure. Impurities may be electron donors such as boron or gallium, or electron acceptors such as arsenic or phosphorous. Electron donors are known as "N" dopants and electron acceptors are known as "P" dopants. In binary compounds such as gallium arsenide, the doping may be accomplished simply by varying the relative amounts of each element.

The dimensions of the device depends upon the application, however for this example assume that the device has the relative dimensions shown by FIG. 1 where: $L^0$ and $L^1 = 10 \times 10^{-6}$M, respectively; $L^2 = 50 \times 10^{-6}$M; $L^3 = 2.56 \times 10^{-3}$M; $L^4 = 2.615 \times 10^{-3}$M; $G = 5 \times 10^{-6}$M; $W = 25 \times 10^{-6}$M; and, $W' = 50 \times 10^{-6}$M. Through industry standard photolithographic techniques, the device is etched so that it forms four superposed segments mounted on the same conductive metallic surface, as shown by FIG. 1. In other words, the crystal C is cut away (separated) along the dual lines 6, 7 and 8. In addition, the metallic top surface S is transversely etched away along lines 9 through 264 (26 through 252, not shown). The configuration at this point consists of a laser diode 1, and three elongated juxtaposed electrically isolated transparent light channels 3, 4 and 5 (transparent at the wavelength of the laser diode). The laser and the three light channels are mechanically fixed with respect to one another by the metallic substrate or base 2 upon which the crystal was deposited. (It should be pointed out that the light channels need not be of the same material as the laser, however fabrication is simpler if it is.) For reasons which will be detailed later, the three light channels will also be cleaved at their ends remote from the laser, in the manner illustrated by FIG. 1.

The gap G also defined by the dual lines 8 should be any integral number of half wavelengths with respect to the light emitted by the laser, however this dimension is not critical to the operation of the device. The gaps defined by the dual lines 6 and 7 can be any dimension but should be small compared to the width of the light channels. The laser diode 1, of course, will be of dimensions so as to be resonant at the frequency of the light it is emitting. Since the conductive metallic top S was etched, as previously described, the laser diode will have a conductive metallic cap 1000 for the purpose of attachment of an electrical conductor, not shown. Each of the three light channels has 256 conductive metallic caps for the same purpose. The metallic base 2 is connected to ground.

The three light channels are: The 0° (zero degree) channel 4, the 180° (one hundred and eighty degree) channel 5, and the detector channel 3.

The optical modulator is composed of the laser diode 1, the 0° channel 4, and the 180° channel 5. The optical modulator may be described as an electrical parallel load, optical serial output shift register. In other words, binary data from a parallel electrical data bus are loaded simultaneously into the shift register and are then emitted as a serial binary train of light pulses. If the two light channels in the optical modulator are 2.56 millimeters in length, and consist of 128 parallel binary inputs, an optical binary output of 4.16 trillion pulses per second would be produced. This would represent about a four thousand fold improvement over the best pulsed laser performance.

Figure 3:
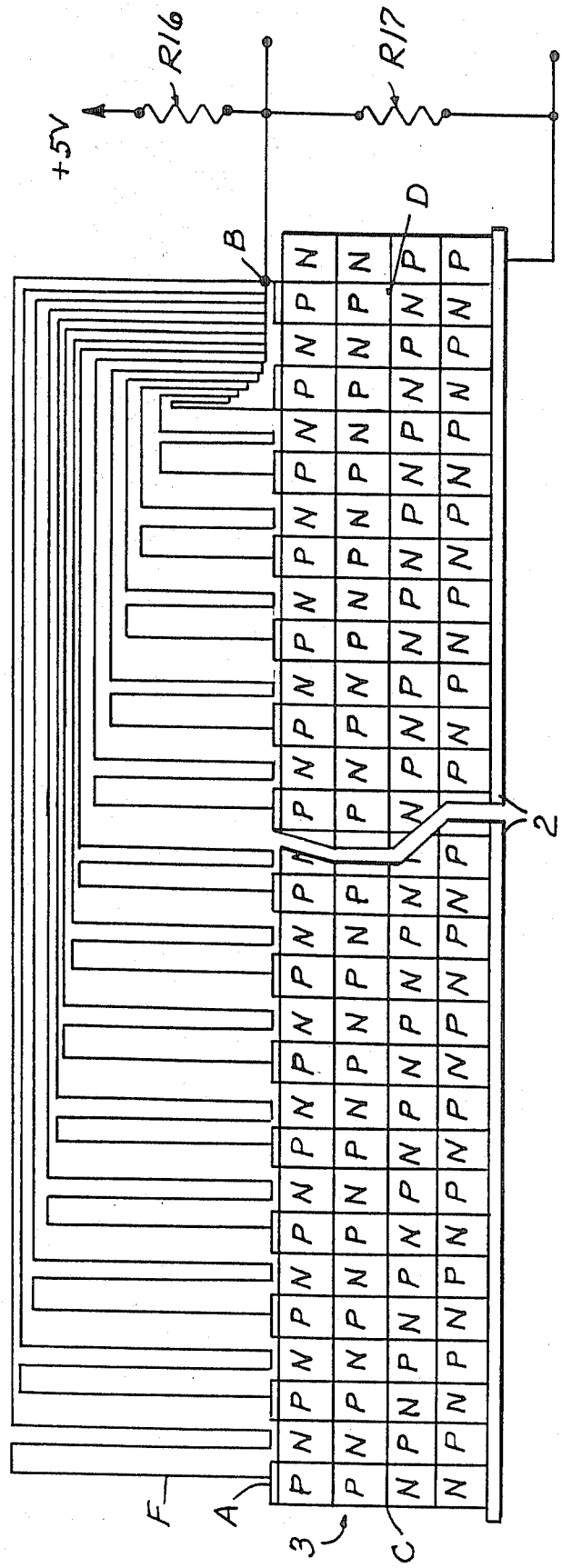
FIG. 3 is a diagram and fragmentary horizontal cross section of a third light channel and associated circuitry forming an optical demodulator.

The optical demodulator is composed of the detector channel 3 and its associated circuit (FIG. 3). (In practice the associated circuitry would be constructed as an integral part U of the original semiconductor chip, however for ease of explanation these parts will be hereinafter discussed as if they were discrete components.) The optical demodulator, since it has the same dimensions as the two light channels of the optical modulator, consists of 128 juxtaposed photodiodes and operates at the same speed as the optical modulator.

Figure 2:
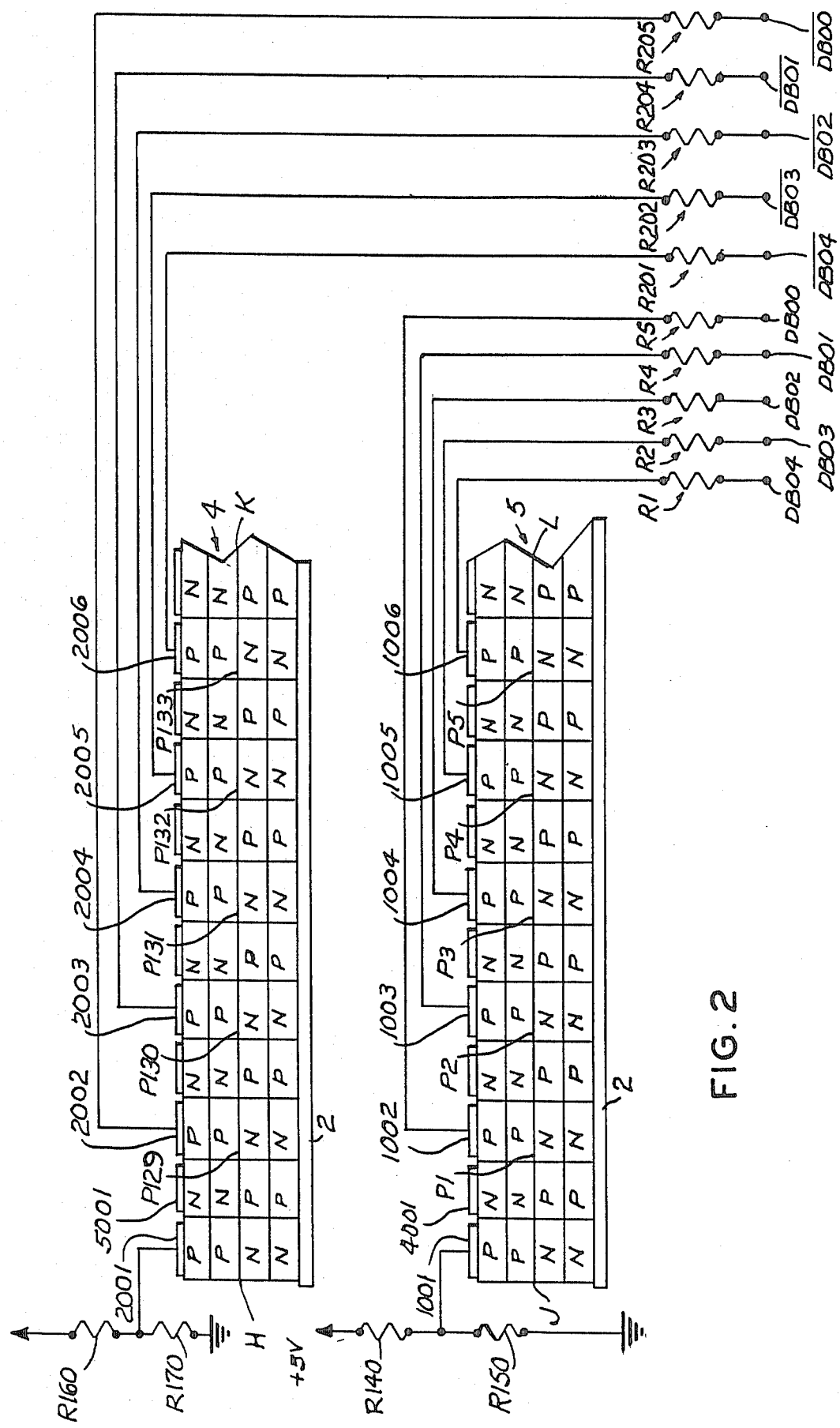
FIG. 2 is a diagram and fragmentary horizontal cross section of a pair of light channels 4 and 5 and associated circuitry forming an optical modulator and an optical logic device.

The logic device consists of the laser diode 1, the 0° channel 4, and the 180° channel 5 and associated circuit (FIG. 2). The logic device performs the logical AND, the logical NAND, the logical OR, the logical INVERT, and the logical EXCLUSIVE OR. Assuming the same relative dimensions given for FIG. 1, a propagation delay per gate of about 240 femto seconds may be achieved. Again, this is about four thousand times faster than the fastest electronic gate. The logical functions are performed photonically.

The light channels 3, 4 and 5 each consist of some number of PN junctions (in this example 256) alternated in their polarity as shown by FIG. 1 (the doping in channels 3 and 4, not shown, is identical to the doping in channel 5). Channel 3 (FIG. 1) consists of PN junctions 3001-3128 in alternation with PN junctions 6001-6128. Channel 4 consists of PN junctions 2001-2128 in alternation with PN junctions 5001-5128. Channel 5 consists of PN junctions 1001-1128 in alternation with 4001-4128. As stated hereinabove, each of the PN junctions and the laser diode 1 have a conductive metallic cap for electrical contact with an electrical conductor. The metallic caps 4001-4128, 5001-5128, and 6001-6128 may be tied to ground, allowed to float, or reverse biased in order to increase the width of the insulating barrier.

Although in this example the crystal is composed of gallium arsenide and gallium aluminum arsenide, the crystal elements actually used will depend in some measure on the application. For instance an optical demodulator might be constructed from an element with a larger band gap such as gallium phosphide or aluminum arsenide in order to attain a higher voltage output. An optical modulator might use InGaAsP (indium gallium arsenic phosphide) so that the output could be tailored to a particular wavelength, for example 1550 nanometers, which is an absorption window in some optical fibers. In applications where wavelength is not particularly important, such as optical logic elements or photonic amplifiers, compounds such as indium antimonide or indium arsenide would generate a larger phase shift, and consequently a larger amplification factor.

Operation

1. Operation of the optical modulator.

A constant lasing voltage is applied to the conductive metallic cap 1000 of laser diode 1, and ground is applied to the conductive metallic base or substrate 2. The active layer of the laser, and the three light channels, lies between the "N" doped and "P" doped layers of GaAs. The GaAs layers are sandwiched between layers of GaAlAs. This forms what is known as a double hetrostructure, wherein the GaAlAs layers have a lower refractive index than GaAs layers, and therefore the light and charge carriers are trapped in the vicinity of the active layer. This forms a very straight and narrow light guide, and insures a maximum interaction between the light and the charge carriers in the active layers. Laser light leaving the laser portion, and entering the two light channel portions of the device will likewise be confined to the active layer, entering at points H and J of FIG. 2. Since the two light channels of the optical modulator are identical parts of the same crystal, the behavior of the light will be identical in each channel, and the phase relationships of the two light beams can be very precisely predicted. The optical distance from the input point to the output point in each channel is the same, the channel ends being at an angle at the output points. This accomplishes two functions. It prevents the generation of standing waves due to reflections (and consequently prevents resonance) inside the light channels, and it projects the light from each channel toward a common convergence point, such as a light window, a fiber optic coupling, or the input to an optical demodulator or the logic device portion of another device on the same substrate, none of the foregoing being shown. The same end could be accomplished by directly coupling the outputs of the light channels to the desired device.

The output of a voltage divider network, resistance R140 and R150 (FIG. 2), is connected to the conductive metallic cap of PN junction 1001, the first element of the 180° channel 5. The output of a voltage divider network resistors R160 and R170 is connected to the conductive metallic cap 2001 of the first element of the 0° channel 4. Although the electrical and optical properties of the two channels are identical, the optical length of either channel may be changed by changing the refractive index of that portion of the crystal. If a positive voltage from the voltage divider network R140 and R150 is applied to the metallic cap of PN junction 1001, a current is caused to flow in the PN junction between the metallic cap and the metallic substrate 2.

Referring to FIG. 2, the PN junctions 4001 through 4128 (4002 through 4128 not shown) and 5001 through 5128 (5002 through 5128 not shown) are not biased and serve to electrically insulate PN junctions 1001 from 1002 from 1003, etc. The refractive index of each element of the crystal is directly proportional to the number of charge carriers in the active layer, i.e., the current level in the junction. This current level may be any level below its threshold. At that point stimulated emission would take place, and the applied voltage could no longer control the refractive index. The values of R140 and R150 are chosen such that the current through that PN junction insures precisely 180° of phase difference in the light from channel 5 with respect to the 0° channel 4, as measured at the point of convergence of the two beams. The remainder of the 180° phase difference results from the fact that, (referring to FIG. 2) in its static condition, complimentary logic levels are applied to the junctions of the 180° channel, as opposed to the junctions of the 0° channel. The outputs transmitted from the two channels then add destructively at their convergence point and result in zero output. The static state of the optical modulator, therefore, is that the phases of the outputs from channels 4 and 5 are 0° and 180° respectively which results in no output (or logical zero).

If a logical high voltage (below the threshold) is applied to input DB00 and a logical low voltage is applied to its complimentary input DB00 and resistors R5 and R205 are of the appropriate values, then the increased number of charge carriers in the active layer of PN junction 1002 of the 180° channel and the decreased number of charge carriers in the active layer of the PN junction 2002 of the 0° channel will, respectively, cause a phase retardation and a phase advance toward 270°. The coherent light passing through 2002 of the 0° channel 4 will therefore be more in phase with the coherent light passing through 1002 of the 180° channel 5 when the convergence point is reached. Now, the outputs transmitted from the two channels add more constructively for a maximum output (or logical one).

At the end of a pulse applied to DB00 and DB00, current through the junction returns to its static value, and the outputs from the two channels again add destructively for no output at the convergence point (or logical zero). If a 0.12 pico second pulse is applied to the DB00 and DB00 inputs, then a 0.12 pico second light pulse will appear at the convergence point (i.e., the light from the two channels will be in phase for 0.12 pico seconds). This was accomplished without having to turn the laser on or off. If logic levels are applied to all the data bus inputs simultaneously (in this case DB00/DB00 through DB132/DB132) then one hundred and thirty-two (132) 0.12 pico second pulses of light will appear at the convergence point. If the optical length of the light channels is 30.72 pico seconds (i.e., $2.56 \times 10^{-3}$ meters and refractive index of 3.6), and there are 132 data bus inputs, then the optical modulator will have an output of $4.29 \times 10^{12}$ pulses per second. The data bus, however, will be operating at only $32.5 \times 10^9$ hertz since 132 light pulses are produced for each electrical bus cycle. This is analogous to the operation of a parallel load, serial output shift register. Each 30.72 pico seconds, 132 data bits are loaded from the bus, and then transmitted as a serial optical data stream. The length of the electrical pulses from the data bus must not exceed the optical length of the individual PN junctions, as this would result in adjacent optical pulses overlapping. Although it is doubtful that the electrical bus can make a transition in 0.12 pico seconds, a pulse that short can easily be produced from the bus transition through RC coupling with a short RC time.

The optical modulator, therefore, produces encoded light pulses at rates in excess of four trillion pulses per second, without having to turn the laser on and off. In addition, the power of the light pulses may be controlled by simply controlling the amount of phase shift produced by each data bus input. The optical modulator, therefore, can function as an amplifier, whereas a change in the voltage applied to a PN junction results in a proportionate change in the output power.

2. Operation of the optical demodulator.

The optical demodulator consists of channel 3 of the device and associated circuitry. FIG. 3 shows a horizontal cross section of a portion of the detector channel.

Conventional construction of photodiodes places the PN junction of the photodiode as near as possible to the irradiated surface so as to insure a maximum interaction of the radiation with the charge carriers in the active region. A bias voltage is applied between the cathode and anode so as to maximize the number of charge carriers. Photons penetrating the irradiated surface (say the anode) and reaching the junction induce electrons in the valance band to make a transition to the conduction band. This results in current flow across the junction and consequently, a voltage drop across a load resistance. A larger irradiated surface insures a larger active layer surface area with which the photons can interact (and therefore, a larger induced current). Because the light must pass through the anode before it reaches the junction, and because any photons which pass through the junctions without interacting are absorbed in the cathode, only a small portion of the useful radiation results in induced voltage. Furthermore the electrical length of a photodiode with a large surface area limits the frequency at which the device can operate. For a large surface area, cathode/anode capacitance is also a problem.

The optical demodulator fragmentarily shown by FIG. 3 similarly consists of a number of forward biased PN junctions (photodiodes), electrically insulated from one another by unbiased reverse PN junctions. Rather than being irradiated at the anode surface, the optical demodulator is irradiated at point C, which is in line with the active region of PN junction 3001. Again, the light is trapped in the active region by the double hetrostructure, thereby insuring maximum interaction. Rather than irradiating the entire surface at once, however, a short light pulse travels through each photodiode individually, irradiating them in succession until it reaches point D. If the electrical length of conductor F from point A to point B is the same as the optical length from point C to point D and the same is true for each of the other conductors with respect to their PN junctions, then the photoelectric pulses from each individual photodiode will arrive at point B simultaneously, and the effect will be the same as if the entire junction (minus the unbiased portion) had been irradiated at once. The light, however, is entirely confined to the useful region, and the cathode/anode capacitance has been reduced. The electrical length of the photodiodes has been reduced by breaking it down into many small photodiodes and superimposing their outputs. The voltage divider network made up of load resistor R17 and pull up resistor R16 insure the proper operating bias for the photodiodes. The length of a light pulse must be shorter than the optical length of the individual photodiodes to insure that adjacent pulses do not overlap.

3. Operation of the integrated optical logic device.

A constant lasing voltage is applied to the conductive metallic cap 1000 of laser diode 1, and ground is applied to the conductive metallic substrate 2. Again the laser light is trapped by the double hetrostructure and confined to the active regions of the 0° channel 4 and the 180° channel 5. Referring to the fragmentary cross section of the light channels 4 and 5 (FIG. 2), light enters at points H and J and travels from H to K and from J to L. The voltage divider network R140 and R150 insures the light from channels 4 and 5 is precisely 180° out of phase at the convergence point (or zero output).

Figure 4:
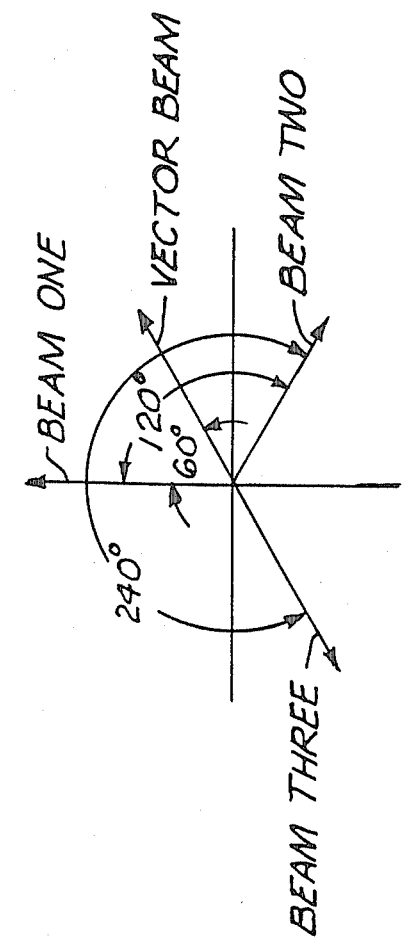
FIG. 4 is a diagram showing, by polar coordinates, the phase relationships of three input beams of an optical logic element.

If coherent light (for instance from another logic device on the same substrate) is projected onto point P1, which is the active region of PN junction 1002, it will cause a small change in the refractive index of 1002. Because the light projected onto P1 is traveling along a line which is perpendicular to the light traveling from J to L, the light projected onto P1 will not interfere with the amplitude of the outpu from light channel 5. It will however cause a phase change in the laser light moving from J to L in channel 5. This is because the refractive index of the crystal is not perfectly linear with respect to the amount of light passing through it. Because the phase of the light in channel 5 has changed with respect to the light in channel 4, the two beams no longer completely cancel and there is an output of light at the convergence point (or logical one). If a short pulse of light (120 femto seconds, or $1.2 \times 10^{-13}$ sec) is projected onto P1, then a 120 femto second pulse will appear at the output. If either of two independent beams of light, herein called beam one and beam two, is projected onto P1, the above described output would result. If the phase relationships of beam one and beam two are 0° and 120° respectively, as shown by FIG. 4, and the amplitude of each beam is 1 (one) (in arbitrary units), and both beams are projected onto P1 simultaneously, the product of the two beams, now called the vector beam, will cause a phase shift in the light from channel 5. The phase shift in channel 5, and consequently the amplitude of the output pulse, will be the same as if there had been only one input. This is because the beams interfere partially destructively in accordance with the following formula: $(\cos\theta° + \cos 120°)^2 + (\sin\theta° + \sin 120°)^2 = (\text{Vector})^2 = 1$: where: $\sqrt{\text{Vector}^2} = 1$ and Vector angle = 60°.

The logic device, therefore, has performed a logical OR function, i.e., a logical high on either or both inputs, results in a logical high output. Since a positive OR is the same function as a negative AND, it also performs the AND function if the inputs and outputs are inverted.

The INVERT function may be performed by the logical NAND. The NAND function is accomplished by adding a third input beam, herein called the third beam, whose phase angle is 240°. The third beam is displaced from both beam one and beam two by 120°, and displaced from the vector beam by 180°. In this configuration, if both inputs are high, they will result in a vector beam of magnitude one (1) at 60°, which will cancel the third beam of magnitude one (1) at 240° resulting in a logical low output. If either beam one or beam two is high and the other low, there will be one beam displaced from the third beam by 120°, which will result in a new vector beam of magnitude one (1) at either 180° or 300°, depending on which input was high. This will result in a logical high output pulse. If both input beams are low there will remain the third beam of magnitude one (1), which will result in a logical high output pulse. In this configuration, therefore, the logic device forms the logical NAND function. It should be pointed out that since each of the logic elements is also a photodiode, the output of each logic element will also be available in voltage form as a voltage drop across resistors R1 through R205.

The logical EXCLUSIVE OR function is performed by the logic device if beam one and beam two alone are projected onto P1 as was done with the OR function, and the two beams are displaced from one another by 180°. In this configuration, a high pulse on either input will result in a high output pulse, however if both inputs are high, the two inputs will cancel (being 180° out of phase) and a low output will result.

The precise phase relationships of beam one and beam two with respect to the third beam are insured by the selection of the appropriate values for resistors R160 and R170 of the logic devices which generated the two beams. These phases, and consequently the values of R160 and R170, will depend on the physical placement of the individual logic devices on the substrate and will be different for different types of integrated circuits, but will, of course, be the same for all integrated circuits made from the same template.

Since the logical function performed by each individual element is strictly a function of phase relationships of the input beams, and those phase relationships can be changed electronically, it is obvious that the hardware configuration of each integrated circuit can be changed from instant to instant to perform any sequence of operations desired. This "dynamic hardware" allows one type of integrated circuit to be used to perform any possible combination of logical operations.

Obviously the invention is susceptible to changes or alterations without defeating its practicability. Therefore, I do not wish to be confined to the preferred embodiment shown in the drawings and described herein.

I claim:

1. A photonic circuit for processing digital information, comprising:
   a substrate;
   crystal means deposited on said substrate for defining a plurality of identical electrically isolated elongated parallel light guiding channels each having an input and an opposing output;
   light source means including a laser having a conductor and supported by said substrate proximate and operatively aligned with the respective light guiding channel input; and,
   a source of electrical energy connected with the light source conductor for energizing the light source means.

2. The circuit according to claim 1 in which the crystal means is a monolithic structure.

3. The circuit according to claim 1 in which the crystal structure is formed by a plurality of polarity alternated PN junctions.

4. The circuit according to claim 1 in which said light source means and a pair of said channels form an optical modulator.

5. The circuit according to claim 2 in which the monolithic structure is a semiconductor chip.

6. The circuit according to claim 4 in which the optical modulator forms a parallel load serial output shift register.

7. The circuit according to claim 4 in which another of said channels forms an optical demodulator.

8. The circuit according to claim 6 and further including:
   logic means formed by said laser means and a pair of said channels for performing AND, NAND, OR, INVERT and EXCLUSIVE OR logical functions.

* * * * *